United States Patent [19]

Dickman et al.

[11] 4,358,889
[45] Nov. 16, 1982

[54] PROCESS FOR MAKING A LATE PROGRAMMING ENHANCED CONTACT ROM

[75] Inventors: John E. Dickman, Russiaville; William B. Donley, Kokomo, both of Ind.

[73] Assignee: General Motors Corporation, Detroit, Mich.

[21] Appl. No.: 268,086

[22] Filed: May 28, 1981

[51] Int. Cl.³ ............................................. H01L 21/72
[52] U.S. Cl. .................................... 29/571; 29/576 B; 29/578; 148/187
[58] Field of Search ...................... 29/571, 576 B, 578; 148/187, 1.5

[56] References Cited

U.S. PATENT DOCUMENTS

| | | | |
|---|---|---|---|
| 3,475,234 | 10/1969 | Kerwin et al. | 148/187 |
| 3,775,191 | 11/1973 | McQuhae | 148/1.5 |
| 3,914,855 | 10/1974 | Cheney et al. | 29/571 |
| 3,917,495 | 11/1975 | Horn | 148/187 |
| 4,080,718 | 3/1978 | Richman | 29/571 |
| 4,103,415 | 8/1978 | Hayes | 29/571 |
| 4,129,936 | 12/1978 | Takei | 29/571 |
| 4,151,020 | 4/1979 | McElroy | 29/577 C |
| 4,198,693 | 4/1980 | Kuo | 29/571 X |
| 4,235,011 | 11/1980 | Butler et al. | 29/577 C |
| 4,246,593 | 1/1981 | Bartlett | 357/41 |
| 4,267,632 | 5/1981 | Shappir | 29/571 |
| 4,294,001 | 10/1981 | Kuo | 29/576 B |
| 4,295,209 | 10/1981 | Donley | 357/91 X |
| 4,317,690 | 3/1982 | Koomen et al. | 29/576 B |

*Primary Examiner*—G. Ozaki
*Attorney, Agent, or Firm*—Robert J. Wallace

[57] ABSTRACT

A method of making a ROM and a two-level polycrystalline silicon RAM on a chip and encoding the ROM in later stages of the method, without adding a mask to the method. The mask used to define the second level of polycrystalline silicon for the RAM is also used to provide an ion implant mask for the ROM.

4 Claims, 31 Drawing Figures

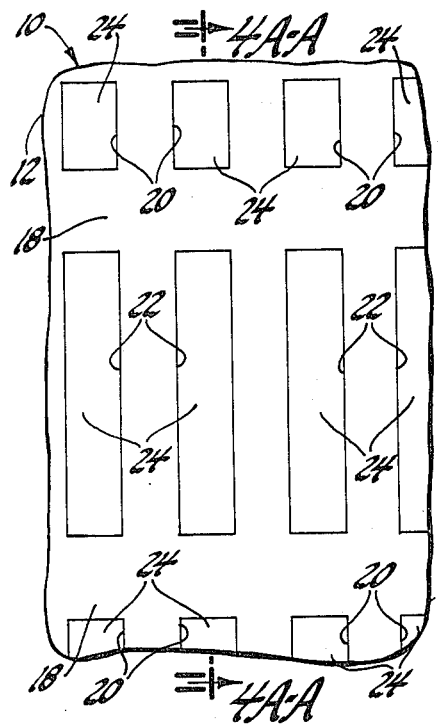 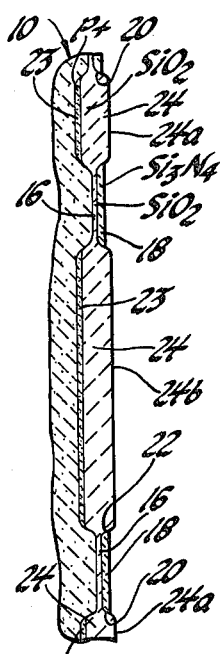 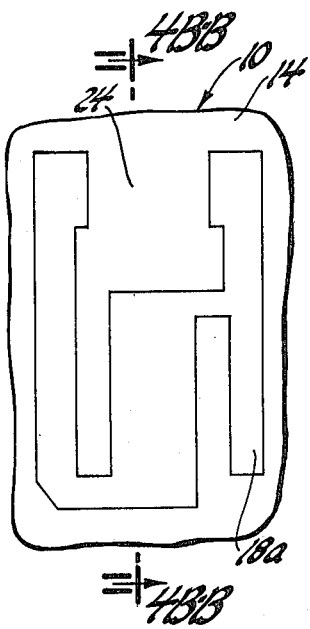 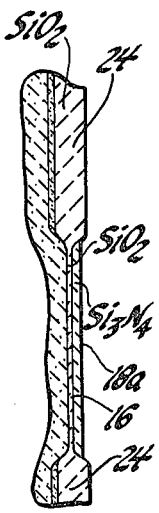
Fig. 4A  Fig. 4A-A  Fig. 4B  Fig. 4BB
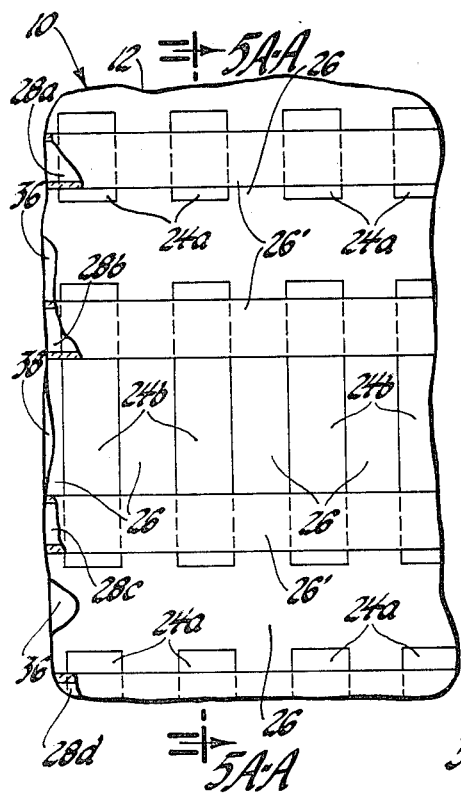 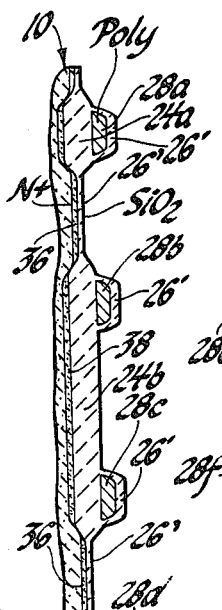 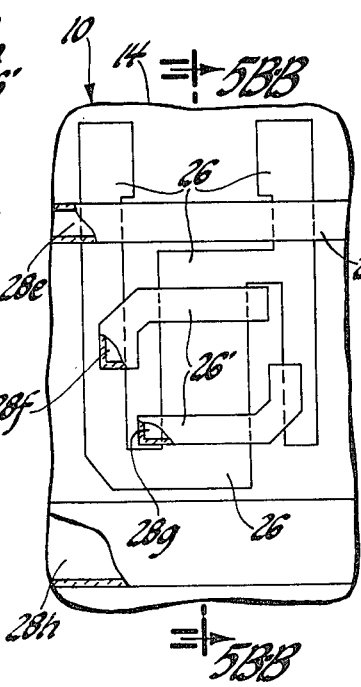 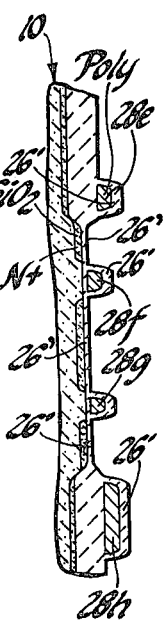
Fig. 5A  Fig. 5A-A  Fig. 5B  Fig. 5BB

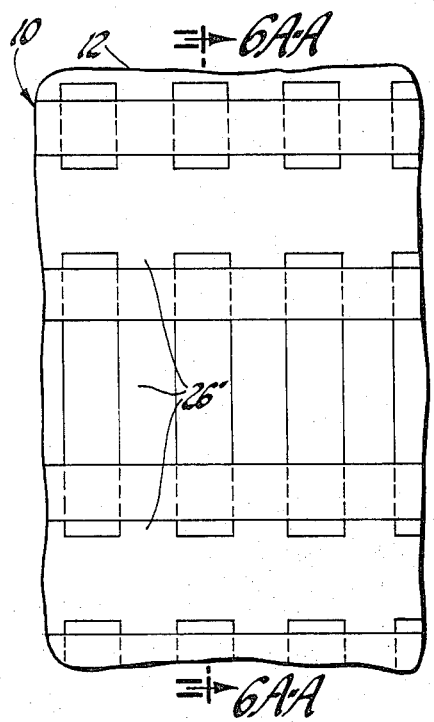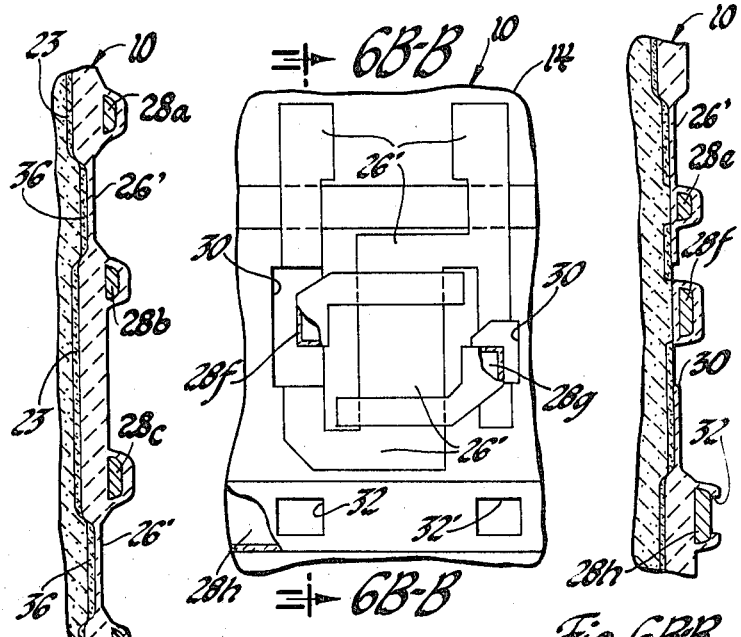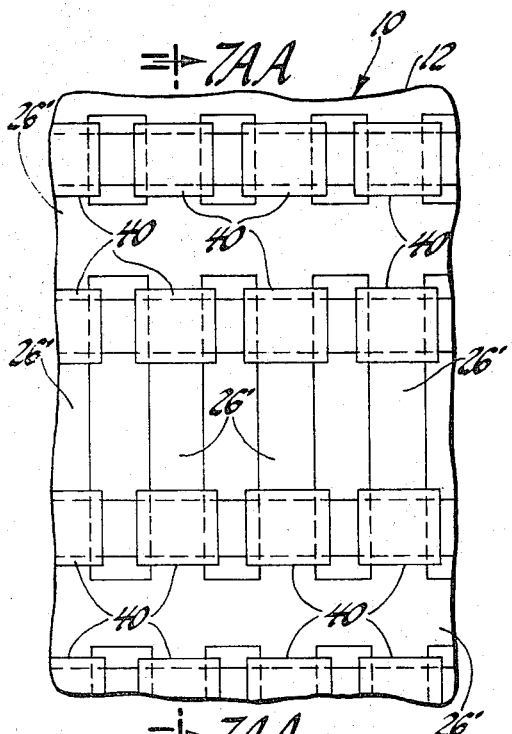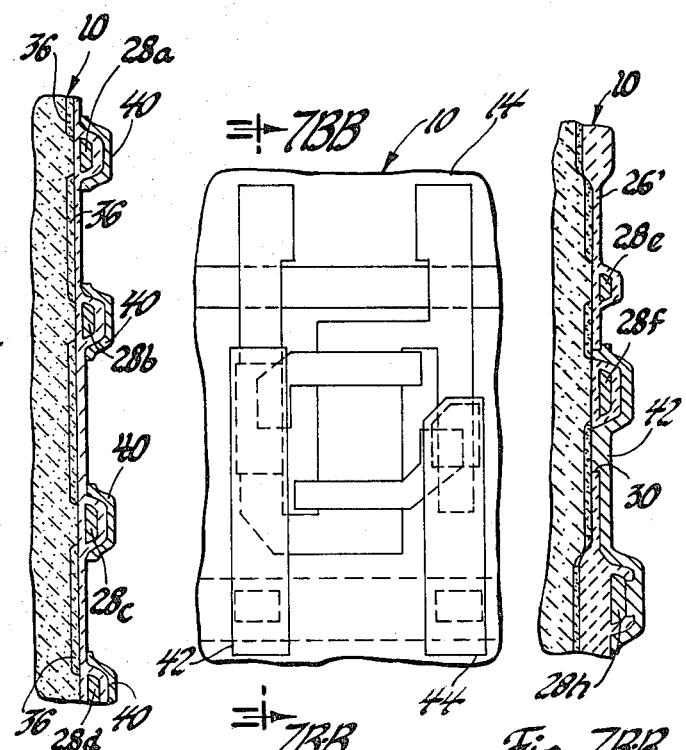

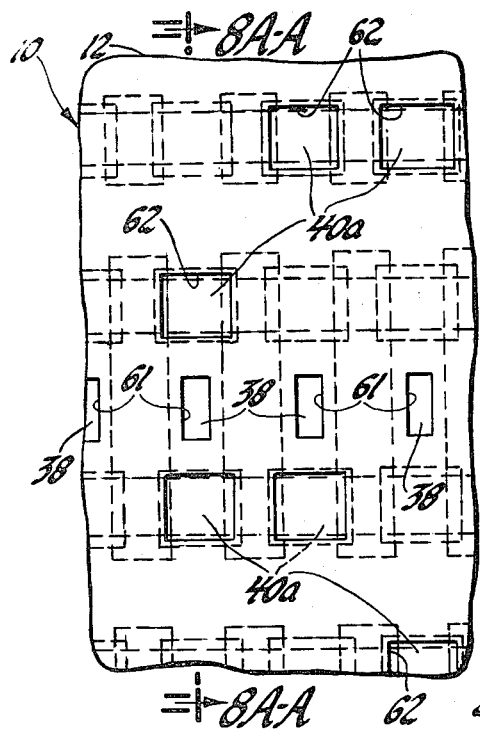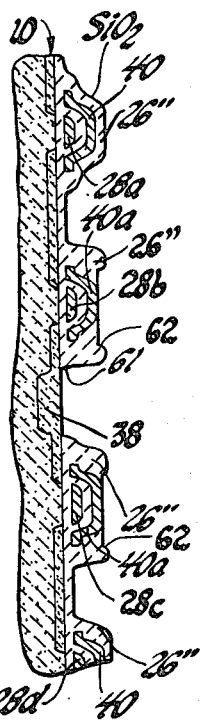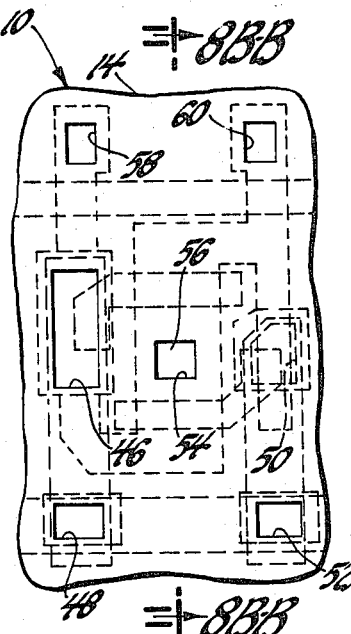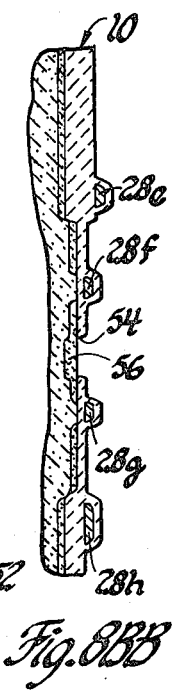
Fig. 8A  Fig. 8A-A  Fig. 8B  Fig. 8BB
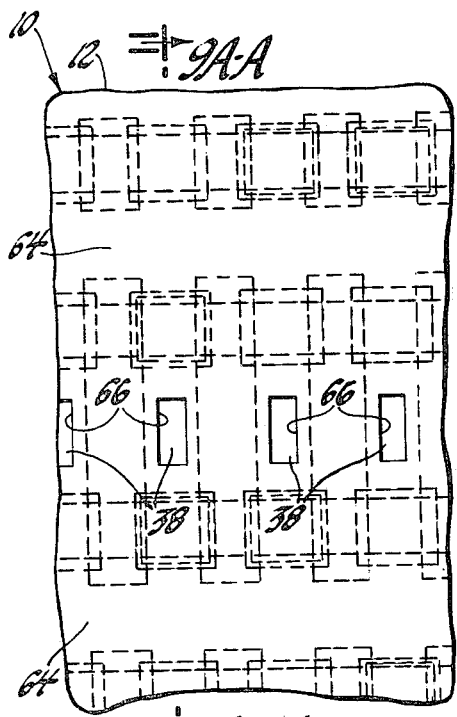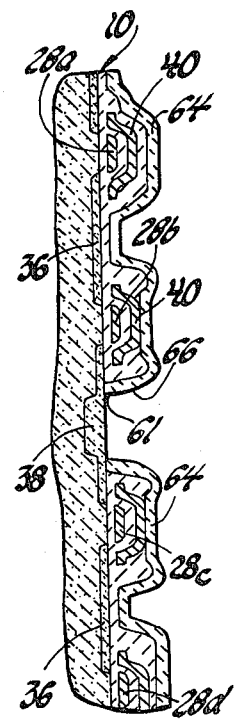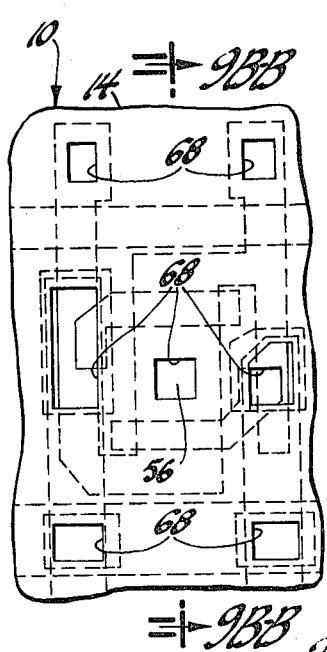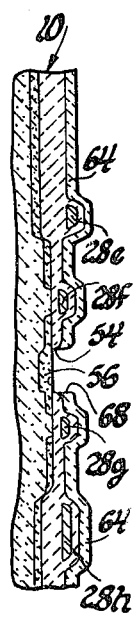
Fig. 9A  Fig. 9A-A  Fig. 9B  Fig. 9BB

PROCESS FOR MAKING A LATE PROGRAMMING ENHANCED CONTACT ROM

RELATED PATENT APPLICATIONS

This invention relates to our concurrently filed and assigned United States patent applications:
Ser. No. 268,090, SINGLE LEVEL POLY LATE PROGRAMMABLE ROM
Ser. No. 268,089, LATE PROGRAMMING USING SECOND LEVEL POLYSILICON MASK
Ser. No. 268,088, LATE PROGRAMMING USING A SILICON NITRIDE INTERLAYER
This invention is also related to W. B. Donley's U.S. Ser. No. 098,211, entitled "Programming an IGFET Read-Only-Memory" and filed Nov. 28, 1979, now Pat. No. 4,295,209.

FIELD OF THE INVENTION

This invention relates to a method of late programming a read-only memory (ROM) by ion implantation through polycrystalline silicon ROM gates. Selected ROM gates are programmed by using an enhancement contact window etch mask as an ion implant mask. A second polycrystalline silicon layer on a chip cooperates with the implant mask.

BACKGROUND OF THE INVENTION

U.S. Ser. No. 098,211 discloses late programming an IGFET ROM by ion implantation. By IGFET, we mean an insulated gate field effect transistor. The ROM comprises an orderly array of such transistors. The IGFETs are ordinarily arranged on a common silicon substrate in a pattern such that the gates of individual transistors are aligned in a number of parallel input rows. The drains of individual devices are aligned in a plurality of parallel columns. In a typical array of horizontal type IGFETs, all IGFET drains can be contacted by a metallization pattern of parallel conductor output strips that overlie and, in plan view, are orthogonal to a pattern of parallel polycrystalline silicon gate input strips. The aforementioned U.S. Ser. No. 098,211 discloses programming the ROM by ion implantation through the polycrystalline silicon gate strips just before metallization, using a reflowable glass layer as a mask. In substance, all ROM gates are potentially active when the polycrystalline silicon gate strips are defined. A blanket silicon nitride coating is applied over the polycrystalline silicon gate strips, and contact openings etched in it. A blanket reflowable glass coating is applied over the silicon nitride coatings, and corresponding contact openings etched in it. However, concurrently, ion implant windows are also etched in the glass coating, over selected ROM gates. No additional masks are needed to perform the ion implantation since two masks are ordinarily needed anyway, to etch first through the glass and then through the underlying thermal oxide. The silicon nitride coating provides an insulating coating over the gate strip portion exposed within the ion implant window. Accordingly, metal drain strips can be applied over the glass in the usual manner. They can pass directly over the selected gate ion implant windows without electrically shorting to the gate strip in the window. Thus, not only is the late programming achieved but high ROM layout density is preserved.

On the other hand, the metal drain strips and the gate strip portions overlap within the ion implant windows with only a thin layer of dielectric therebetween. This generates a parasitic capacitance. In small ROM arrays the cumulative effect of this parasitic capacitance is not particularly significant. However, in large ROM arrays it can accumulate sufficiently to significantly slow down ROM operating speed. We have now discovered how to avoid this parasitic capacitance but still obtain late programming, without increasing ROM size. In addition, we have discovered a technique whereby such late programming can be achieved without adding another mask to the ROM manufacturing method, over mask sets typically used in making IGFET ROM arrays.

OBJECTS AND SUMMARY OF THE INVENTION

It is, therefore, an object of this invention to provide an improved technique for programming an IGFET ROM late in its manufacturing method.

Another object of the invention is to provide an improved late programming technique for a ROM made on a chip by a method that includes delineating two polycrystalline silicon layers.

The invention comprehends forming a ROM array of IGFETs on a silicon surface. Each IGFET is operable and has a shallow drain region, a channel region and a polycrystalline silicon gate electrode. The gate electrode is readily penetrable by an ion beam. Each gate electrode is covered with a protective second level polycrystalline silicon coating that is also readily penetrable by an ion beam and that overlaps each IGFET channel periphery, especially adjacent the channel-drain region interface. An enhancement contact window etch mask for the IGFET drain regions is then applied to the silicon surface. However, the contact enhancement etch mask also contains openings over selected IGFET channels. Before removing this mask, the silicon surface is given a blanket ion implantation to significantly change threshold voltage of selected channels exposed by the etch mask. Etching enhancement contact windows over the IGFET drains also etches windows over the selected IGFET channels. However, the channels are protected by the second level polycrystalline silicon coating. An enhancement diffusion is then performed. A thick blanket insulating layer is then deposited, and windows etched in it over the enhanced contact areas but not over the IGFET channels. A conductor pattern of drain lines is then formed on the insulating layer, and a passivation coating applied over the conductor pattern. The second level polycrystalline silicon coating is preferably a layer already used on the silicon surface in a discrete resistor or capacitor, or in a random-access memory (RAM).

BRIEF DESCRIPTION OF THE DRAWING

Other objects, features and advantages of this invention will become more apparent from the following description of preferred examples thereof, and from the drawings, in which:

FIGS. 4A through 10A show enlarged fragmentary plan views of the ROM array shown in FIG. 1, depicting it in successive stages of its manufacturing method;

FIGS. 4A-A through 10A-A show cross-sectional views taken along the line A—A of FIGS. 4A through 10A, respectively;

FIGS. 4B through 10B show enlarged fragmentary plan views illustrating one cell in the RAM array shown in FIG. 1; and FIGS. 4B-B through 10B-B show sectional views along the line B—B of FIGS. 4B through 10B, respectively.

DESCRIPTION OF THE PREFERRED EMBODIMENTS

Figure 1:
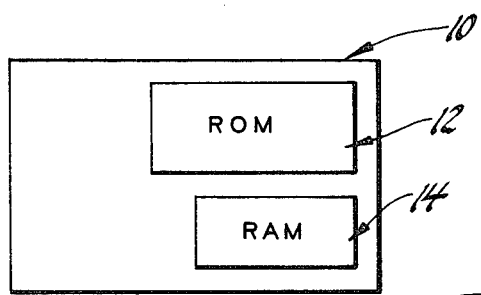
FIG. 1 is a diagrammatic view of a silicon chip containing two different IGFET arrays with one array forming a ROM and the other array forming a RAM.

FIG. 1 shows a silicon chip 10 containing a ROM array 12 and a RAM array 14. As previously indicated, by ROM we mean a read-only memory. By RAM we mean a random-access memory. In this specific example, we mean it to be a static RAM made by a double level polycrystalline silicon process such as illustrated in connection with FIGS. 4B through 10B and 4B-B through 10B-B. By static RAM we mean a RAM having a memory that is not periodically refreshed. Another type of static RAM produced by a double level polycrystalline silicon process is disclosed in U.S. Pat. No. 4,246,593. The ROM is ordinarily an array of IGFET channel regions, loosely referred to as gates, arranged in columns and rows with all the channel regions from two adjacent rows paired to share one long source region. The long source region serves as a source line. One long gate electrode serves as a common electrode for all gates in a row, and thus is referred to as a gate line. It provides an input line for the memory. In plan view the resultant configuration appears as a strip-like diffusion area lying between two parallel gate electrodes. The array is covered with an insulating coating having discrete windows therein over the drain region for each channel. One metal strip makes contact with all drain regions in a given column. A plurality of columns thus require a plurality of parallel metal strips, which are referred to as drain lines. In plan view the drain line pattern is generally orthogonal to the gate line pattern, as can more readily be seen by reference to FIG. 2.

Figure 2:
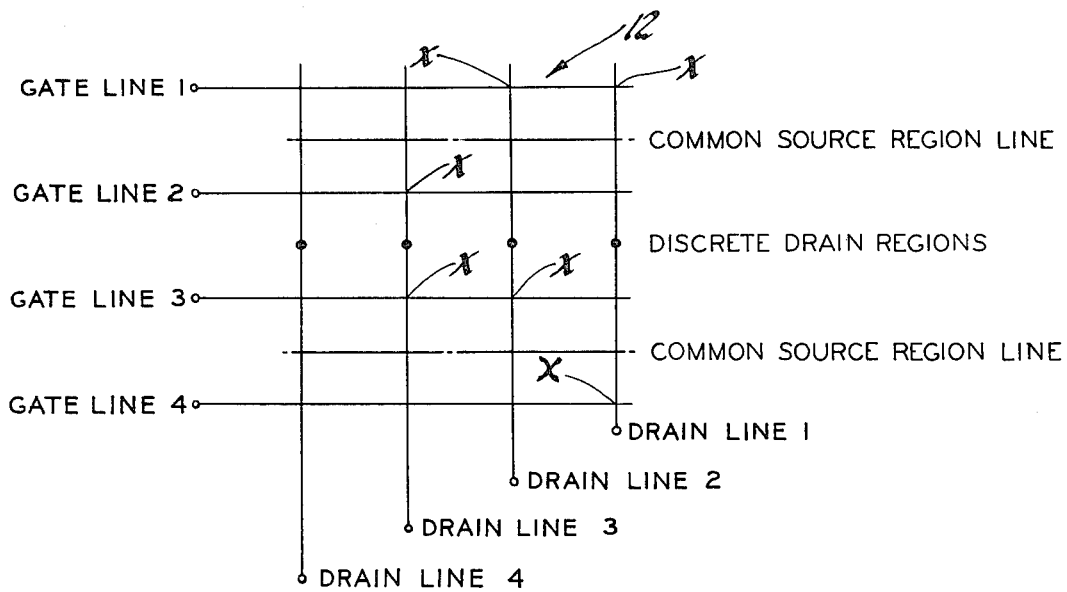
FIG. 2 schematically shows the ROM portion depicted by FIGS. 4A through 10A and FIGS. 4A-A through 10A-A.

A portion of such a ROM array is illustrated in FIG. 2. It is shown as programmed by the method illustrated in subsequent Figures of our drawing. A gate occurs at the intersection of each gate line and drain line. The intersections marked by an "X" correspond to IGFET channels under polycrystalline silicon patches 40a in FIGS. 8A that are selectively implanted with boron. These channels have their threshold voltage selectively raised by ion implantation, to a level above ROM gate line normal operating voltage. Hence, these gates will not be turned on by applying normal gate operating voltage. Accordingly, they will appear as a "0" in the ROM code, while the balance of the gates appear as a "1".

Figure 3:
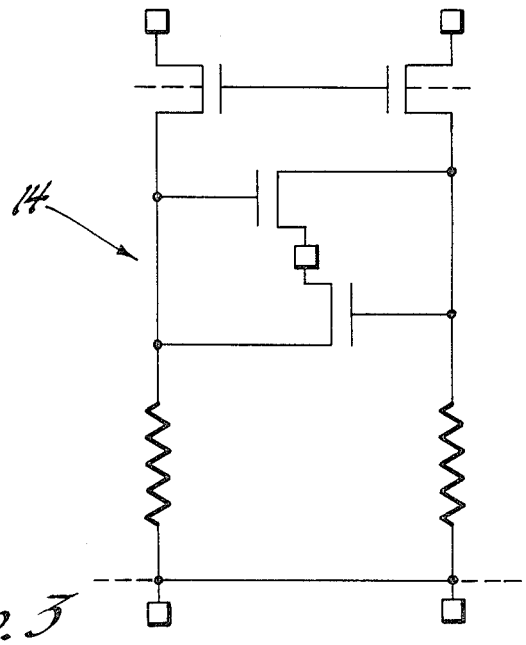
FIG. 3 schematically shows the RAM cell depicted in FIGS. 4B through 10B and FIGS. 4B-B through 10B-B.

FIG. 3 is an electrical schematic of the static RAM cell illustrated in FIGS. 4B through 10B and FIGS. 4B-B through 10B-B. The circuit schematic of FIG. 3 is laid out to directly correspond to the RAM cell layout shown in the FIGS. 4B through 10B and FIGS. 4B-B through 10B-B.

The chip 10 illustrated in FIG. 1 is one of many chips integrally formed in a repetitive pattern on a monocrystalline silicon wafer (not shown) of three of four inches in diameter, and having a thickness of about 0.4–0.6 millimeter. The wafer, and therefore chip 10, would typically be homogeneous and have a resistivity of about 5–30 ohm-centimeters. The particular resistivity, of course, will depend upon electrical characteristics of the finished devices that are desired. The thickness of the wafer is ordinarily a function of the wafer size being processed, with three inch wafers usually being about 0.4 millimeter thick.

In this invention, an enhancement diffusion window etch mask is also used as an ion implant mask, in combination with a second level polycrystalline silicon layer. The second level polycrystalline silicon layer could be for a resistor. In such instance, late programming is achieved without adding any masks to the manufacturing method. However, it is especially useful if the second level polycrystalline silicon is used for making a static RAM 14 on chip 10 along with ROM 12. For this reasons, both the process of making a ROM and a RAM simultaneously on the same chip is illustrated in the drawings. FIGS. 5A and 5B, respectively, show portions of the ROM 12 and RAM 14 of the same chip 10 at the same stage in the manufacturing process. This is also true for FIGS. 6A and 6B, 7A and 7B, etc.

The silicon wafer containing chip 10 is initially lapped, polished and cleaned in the normal and accepted manner. The wafer is then given an initial oxidation in air or oxygen at a temperature of more than about 1000° C., to produce a blanket silicon dioxide coating 16 about 700–1000 angstroms thick. A blanket coating of silicon nitride ($Si_3N_4$) 18 is then formed on the top of the silicon dioxide coating 16. The silicon nitride coating can be deposited in any convenient manner, as for example pyrolysis of a silicon-containing hydrocarbon gas at a high temperature, as is disclosed in U.S. Pat. No. 3,917,495 Horn. A glow discharge plasma reaction between silane and nitrogen, with or without ammonia, at about 300° C. is described in U.S. Pat. No. 4,091,406 Lewis for producing a silicon nitride coating that is not quite stoichiometric.

An array of rectangular apertures 20 and 22 are then photolithographically etched into the silicon nitride coating in the ROM area as shown in FIG. 4A. The wafer is then given a blanket boron implant to form the P+ channel stop regions 23 within each window 20 and 22. An implant of $^{11}B+$ at a dosage of about $6 \times 10^{12}$ ions per square centimeter at an energy of about 70 keV can be used. The photoresist (not shown) used to etch windows 20 and 22 is stripped from the silicon nitride coating. The wafer is heated in steam or moist oxygen at about 1000°–1100° C. for several hours to form a 6000–12,000 Angstroms thick field oxide 24 within windows 20 and 22, designated by reference numerals 24a and 24b. During field oxidation the upper surface of silicon dioxide islands 24a and 24b rises above the matrix covered by silicon nitride coating 18. They also consume silicon beneath them as they grow. However, P+ regions 23 diffuse inwardly faster than oxidation proceeds. Hence, P+ regions 23 appear beneath thick oxide islands 24a and 24b in FIGS. 4A-A and following cross-sectional views.

At the same time ROM windows 20 and 22 were opened, all of the silicon nitride coating was removed from each cell of RAM 14 except for an irregular patch designed by reference numeral 18a. Accordingly, after the aforementioned field oxidation, field oxide 24 also covers the RAM cell area except beneath the irregularly shaped silicon nitride patch 18a.

After field oxidation, the silicon nitride coating 18 remaining on the slice is removed, as by plasma etching with carbon tetrafluoride or by immersion for 10-60 minutes in orthophosphoric acid ($H_3PO_4$) at about 150°-160° C. The thin initial silicon dioxide layer 16 is then also removed, as for example by immersion in hydrofluoric acid, ammonium bifluoride, or the like. The wafer is then again placed in a furnace having an air or oxygen atmosphere and heated to a temperature of approximately 900°-1100° C. for a sufficient duration to grow a new thin silicon dioxide coating 26 of approximately 500-1000 angstroms in thickness. This new thin silicon dioxide layer is to serve as a gate dielectric in the ROM and RAM IGFETs to be subsequently made.

The wafer is then given another ion implantation, to adjust threshold voltage of the devices that are subsequently to be formed. Implantation with $^{11}B+$ in a dosage of about $2 \times 10^{11}$ ions per square centimeter at about 35-75 keV is an example of what might be used. However, the particular dopant, dosage and power used can be varied, as should be understood depending upon the particular resistivity of the wafer, gate oxide thickness used, and threshold voltage that is desired in the resultant devices.

As shown in FIGS. 5A and 5B, at this point in the method gate oxide 26 is present in a grid-like pattern in the ROM area, surrounding field oxide rectangular islands 24a and 24b. In the RAM area the thin gate oxide 26 is present in the same area previously covered by the irregularly shaped silicon nitride patch 18a. A blanket coating of polycrystalline silicon is deposited over the entire face of the wafer including all of ROM area 12 and RAM area 14 of chip 10. Polycrystalline silicon layer can be formed by chemical vapor deposition, evaporation, sputtering or the like. In general, it would have a thickness of about 4000-6000 angstroms for self-aligning gate purposes. At least 4000 angstroms is generally needed to obtain a low resistance gate. Above about 6000 Angstroms in thickness ion beam energy greater than about 200 keV may be needed to penetrate this and the subsequently applied polycrystalline silicon layer 34. The polycrystalline silicon layer is preferably undoped, i.e. intrinsic, as deposited and then doped with an N-type impurity to a sheet resistivity of about 20-50 ohms per square. It can be subsequently doped when the source and drain regions are diffused. On the other hand, there is no serious objection to doping the polycrystalline as deposited. It should also be recognized that ion implantation can be used instead of diffusion to dope the polycrystalline silicon layer. In any event, the blanket polycrystalline silicon layer is then photolithographically delineated over the ROM into a series of parallel strips 28a, 28b, 28c and 28d by well known plasma etching techniques, such as with $CF_4$ containing $O_2$. These latter strips are oriented parallel to silicon matrix rows covered by gate oxide 26 and orthogonal to columns of that silicon matrix. Mutually parallel gate strips 28a, 28b, 28c and 28d orthogonally cross over the field oxide islands 24a and 24b between matrix rows. Wherever the gate strips cross a matrix column, an IGFET gate is formed. Concurrently, polycrystalline silicon layer is delineated in the RAM area, to provide segments 28e, 28f, 28g and 28h over each static RAM cell, as seen in FIG. 5B.

The silicon wafer containing chip 10 is then immersed in hydrofluoric acid or ammonium bifluoride to remove all portions of gate oxide 26 not covered by the polycrystalline segments 28a through 28h. After photoresist removal, arsenic is implanted or diffused into all exposed silicon, including uncovered silicon matrix portions and polycrystalline silicon segments 28a through 28h. If implanted, an arsenic dose of about 1 to $10 \times 10^{15}$ ions per square centimeter at an energy of about 50-75 keV can be used. Source regions 36 and drain regions 38 are formed in the ROM matrix, and analogous regions in the RAM. The arsenic diffusion is done shallowly. Arsenic provides a smaller lateral diffusion than phosphorus, which permits closer line spacing layout. Arsenic can be diffused and any implantation damage annealed by placing the wafer in a 1000° C. furnace in a nitrogen ambient for 50-100 minutes. In the later stages of the arsenic diffusion, the drive-in atmosphere is changed to oxidizing. This regrows a thin oxide coating 26' over the arsenic diffusion regions. This concurrently oxidizes the exposed surface portions of the polycrystalline silicon of segments 28a-28h. The status of the ROM and RAM portions of the chip 10 at this point is illustrated in FIGS. 5A and 5B, respectively.

In the next step of our method, a mask is applied to the wafer to open shared contact windows 30 for the polysilicon segments 28f and 28g and contact windows 32 and 32' at opposite ends of the polycrystalline silicon segment 28h. The result is shown in FIG. 6B. The ROM is not changed. Hence, FIG. 6A appears to be the same as shown in FIG. 5A, except for the addition of the thin oxide coating 26' on polycrystalline silicon gate lines 28a, 28b, 28c and 28d.

Referring now to FIG. 7A, a second blanket layer of polycrystalline silicon is then deposited over the entire wafer containing chip 10. This would include, of course, the ROM 12 and RAM 14. This second polycrystalline silicon layer can be deposited in the same manner as previously mentioned for the first polycrystalline silicon layer 28. In general, we would prefer that this layer also have a thickness of approximately 4000-6000 Angstroms but in some instances only about 3000 Angstroms might be permissible. The second polycrystalline silicon layer is then doped to appropriate resistivity with arsenic or phosphorus. It can be doped by diffusion or implantation, preferably implantation, to provide greater control of sheet resistivity.

After the second polycrystalline silicon layer 34 has been doped, it is photolithographically masked and etched, to define a plurality of patches 40 that completely cover each IGFET gate in the ROM and overlap its edges. The second layer of polycrystalline silicon can be etched in precisely the same manner as previously described for the first polycrystalline silicon layer. Second layer polycrystalline silicon patches 40 do not allow any edge of the gate lines 28a, 28b, 28c or 28d to be exposed where they cross thin oxide regions 26. Diffusion of the arsenic into the silicon matrix portions not covered by the gate lines 28a, 28b, 28c and 28d provides an array of IGFETs having strip-like source regions 36 along the row portions of the matrix and drain regions 38 along column portions of the matrix, below oxide 26'. Drain regions 38 lie between gate lines 28b and 28c, and common outputs for adjacent gate pairs, between the adjacent pairs of source lines 36. The patches 40 of the second polycrystalline silicon layer do not allow any portion of the gate lines 28a, 28b, 28c and 28d to be exposed where they overlap source and drain regions 36 and 38. As mentioned above, every IGFET gate has a patch 40, of the second polycrystalline silicon layer, covering it. These patches 40 are formed in the same step during which polycrystalline silicon resistors 42 and 44 are formed on each static RAM cell as can be seen in FIG. 7B. Consequently, no additional photomasking is needed to produce patches 40.

After polycrystalline silicon layer 34 has been defined, the photoresist used in etching it is removed. The semiconductor wafer is then heated again in an oxidizing atmosphere such as air or oxygen, for approximately one hour at a temperature of about 1000° C. or more. The slice is heated for a sufficient duration to grow a thermal oxide on the polycrystalline silicon of about 1500–2500 angstroms in thickness. As previously mentioned, source regions 36 and drain regions 38 were formed by a shallow diffusion using arsenic. This permits extremely close line spacing because there is a corresponding lesser lateral diffusion which occurs. However, it is difficult to make satisfactory ohmic contacts to such shallow diffusions. Consequently, it is desirable to enhance the portions of the wafer where ohmic contacts are to be made. For this purpose, contact windows would be opened on those portions of the wafer where ohmic contacts are to be made. Concurrently, it is desired to enhance ohmic contacts on end portions of resistors 42 and 44 in the RAM cell. Consequently, windows 46 and 48 are opened over the ends of RAM resistor 42 and windows 50 and 52 are opened over the ends of RAM resistor 44. Additional windows are opened up in the RAM cell for ohmic contact purposes. For example, window 54 is opened over RAM cell source region 56. Windows 58 and 60 are opened on the upper arms of the RAM cell for subsequent attachment to data lines (not shown). Windows 61 are opened over ROM drains 38.

The photoresist used to etch the enhancement contact windows is also used in this invention as an ion implantation mask. This is achieved by simply including apertures 62 in the photoresist over gates that are to be made unresponsive to normal gate voltage. More specifically, when the enhancement contact windows are opened as illustrated in FIGS. 8A and 8B, the photoresist (not shown) used in opening these windows is also patterned in still another way. It is patterned to also have openings over selected patches 40a of the second level polycrystalline silicon patches 40 previously placed over all ROM gates. The photoresist opening is present only over those ROM gates which are desired to be a "0" in the resultant ROM code.

In addition, the ion implantation openings are disposed completely within the periphery of the underlying selected patches 40a, when these patches are observed in the plan view shown in FIG. 8A. Such disposition of the ion implant openings allows the enhancement contact mask to serve the dual function of (1) ion implantation and (2) enhancement contact window opening. The ion implantation opening in the photoresist, it should be appreciated, will allow the silicon dioxide coating 26" to be etched away over the selected polycrystalline silicon patch 40a, when enhancement contact windows 46 through 56 are opened. Thus, additional oxide openings 66 are inherently formed over the selected gate patches 40a. This is not objectionable, as long as a critical edge of the patch 40a is not exposed. A critical edge would be one that allows the subsequent enhancement diffusion to significantly alter the properties intended for the IGFET channel involved. For example, if patch 40a only slightly overlaps the channel and an edge of it is exposed over the IGFET source or drain region, the subsequent enhancement diffusion could travel laterally under patch 40a, and shorten IGFET channel length. If the IGFET is short to begin with, as is desired for highest ROM density, the enhancement diffusion might even bridge the channel. This would produce electrical continuity between the IGFET source and drain. That IGFET would therefore continually be "on" regardless of the subsequent ion implantation that is used to turn it "off". That IGFET could therefore only be a "1" in the ROM code. If no edge of a gate line 28a, 28b, 28c and 28d is exposed within the gate line silicon dioxide window 62, such deleterious diffusion will not occur.

The ion implantation should traverse the entire width of the IGFET channel. However, it need not cover the entire channel length. Hence, variations in what we have described are permissible, while still practicing the spirit of the invention. On the other hand, for assuring highest yields in a high density ROM, we prefer to have the patches 40 and 40a entirely covered and even overlap the edges on all four sides of their respective IGFET channels. In this latter connection, it should be recognized that the amount of channel overlap required for patches 40 and 40a in the columnar and row directions, as well as the inward spacing needed in these directions for windows 62 (i.e., the ion implant opening in the photoresist) will be a function of the tolerances needed for the particular masking system, device tolerances, and process parameters that are involved. For example, in a 5 micron minimum line width process, one may want the patches 40 and 40a to overlap the IGFET channels by about 1.5 microns. The ion implant opening in the photoresist mask (i.e., windows 62) should be large enough to traverse the IGFET channel width. However, they should be about 2.0 microns smaller than patches 40 and 40a are, especially along the IGFET channel length. No such additional ion implant openings are opened over the RAM cell shown in FIG. 8B.

After the photoresist has been applied to the wafer and appropriately developed, the wafer is given a blanket ion implant. Implantation is done after the mask is used to etch the aforementioned enhancement contact windows 46–56, 58 and 60. The silicon wafer is immersed in hydrofluoric acid or ammonium bifluoride to wash away the thin silicon oxide coating over the enhancement contact regions in both the ROM and the RAM. As hereinbefore mentioned, this opens enhancement contact windows 46–56, 58 and 60 over the ROM and RAM. It also incidentally removes the thin silicon dioxide coating 26" over patches 40a exposed within the ion implant openings of the photoresist. However, this latter action is not detrimental, as hereinbefore noted, so long as the previously mentioned considerations are observed.

Implantation is performed with $^{11}B+$ in a dosage of about $5 \times 10^{13}$ ions per square cm and at an energy of about 200 keV. Any dosage and energy that will effectively turn off the related ROM gates can be used. The particular dosage and energy needed will vary, of course, depending upon the operating potential selected for the ROM gate lines, the initial resistivity of the silicon wafer, the thickness of the polycrystalline silicon layers 28 and 34 and their associated oxide layers, etc. In most instances, an energy of at least about 150 keV would probably be required, and a dosage of at least about $1 \times 10^{13}$ ions per square cm would be desired. One desires a dosage sufficient to change the threshold voltage of affected IGFETs to such an extent that they are irresponsive to a predetermined gate voltage. In the present example we raise threshold voltage to any level significantly above the normal gate operating level of the ROM. For example, if the operating level of the ROM is approximately 5 volts, one would want to raise the threshold of the voltage of the affected gate to 7 or 8 volts, or even higher. Still further, while we describe implanting the affected gate with $^{11}B+$ it is recognized that other P-type impurities could be used to increase IGFET channel P-type doping, and the attendant IGFET threshold voltage.

It should be recognized that if this example were of a p-channel IGFET, instead of an n-channel IGFET, one would want to implant the channel with an N-type impurity to raise threshold voltage. Analogously, the ROM described in the foregoing specific example of the invention comprises an array of enhancement-type IGFETs. One might choose to make a ROM array using depletion-type IGFETs instead. This invention is also applicable to ROMs made with depletion-type IGFETs.

The photoresist is then stripped from the wafer and phosphorus diffused into the windows 46–56 and 58–61, and also incidentally into windows 62. Diffusion into gate lines 28a–28d via windows 62 is not objectionable. FIGS. 8A and 8B show the surface of the slice after phosphorus has been diffused into these windows.

As can be seen in the cross-sectional views of FIGS. 8A-A and 8B-B, the phosphorus diffuses deeper into the silicon surface than the arsenic, to enhance making suitable ohmic contacts to these regions. It can also be seen that patches 40a serve to isolate this enhancement diffusion from any detrimental effect on their underlying IGFETs. If one desires to regrow a thin layer of oxide while driving in the phosphorus, it is permissible. However, if done, the regrowth should be minimized. Otherwise, the wafer may have to be remasked just to etch through the regrowth. The reason for this is that there is an etching rate difference between a thermal oxide and the reflowable phosphosilicate glass layer which is to be next applied.

A blanket layer of a reflowable glass 64, such as phosphosilicate glass, is then applied to the wafer and annealed at about 100°–1100° C. for about 10 minutes to densify it and smooth out the wafer surface. The phosphorus doped glass 64 can be deposited in any convenient manner, as for example by chemical vapor deposition of silane and phosphine. Any of the normal and accepted practices and glass-like materials ordinarily used to insulate and smooth out the surface of IGFET ROMs can be used in this invention too. A thick layer of a low melting passivating glass such as a phosphosilicate glass is preferred. The minimum thickness of glass 64 which is needed to smooth out the surface of the slice will vary. However, a thickness of about 5000–15,000 Angstroms is preferred. Any insulating material which will serve to smooth the surface can be used for layer 64. We prefer to use a glass having a melting point temperature that permits reflow at about 1000°–1100° C. in about 10 minutes. Higher temperatures and/or longer periods of time are not desired since they can produce additional unwanted diffusion of already-diffused phosphorus and arsenic.

As seen in FIGS. 9A and 9B, phosphosilicate glass layer 64 is then photolithographically etched to open contact windows 66 over the drain regions 38 of the ROM and RAM contact windows 68. The windows are photolithographically etched in glass layer 64 in the normal and accepted manner, for example, using hydrofluoric acid or ammonium bifluoride. If a significant thickness of silicon dioxide has been regrown in the phosphorus enhancement contact windows 46–56, 58 and 60 of FIGS. 8A and 8B, a double masking may be needed for this etching to prevent a deleterious lateral etching of the glass while etching through the more slowly etchable thermal oxide. However, because of the added presence of polycrystalline silicon patches 40 over each ROM gate, double masking is probably unnecessary in the ROM. Even if the glass etches laterally and a drain contact opening 66 extends out over a gate line 28b or 28c, no drain-to-gate short will result when the wafer is metallized in the next step. The ROM IGFET gates are all electrically isolated by their covering patches 40. Thus, this invention provides some additional masking tolerance.

After ROM contact windows 66 and RAM contact windows 68 are etched in the glass layer 64, a blanket layer of metal is then applied over the phosphosilicate glass layer 64. The blanket layer of metal 70 can be applied by any technique and can be of any suitable single or multiple layer. We prefer to use a single layer of aluminum or aluminum-silicon alloy applied by evaporation techniques. The metal layer fills the windows in the overlying insulating coatings and makes electrical contact with the appropriate surface regions of the silicon slice in both the ROM and RAM as shown in connection with FIGS. 10A-A and 10B-B.

Figure 10A:
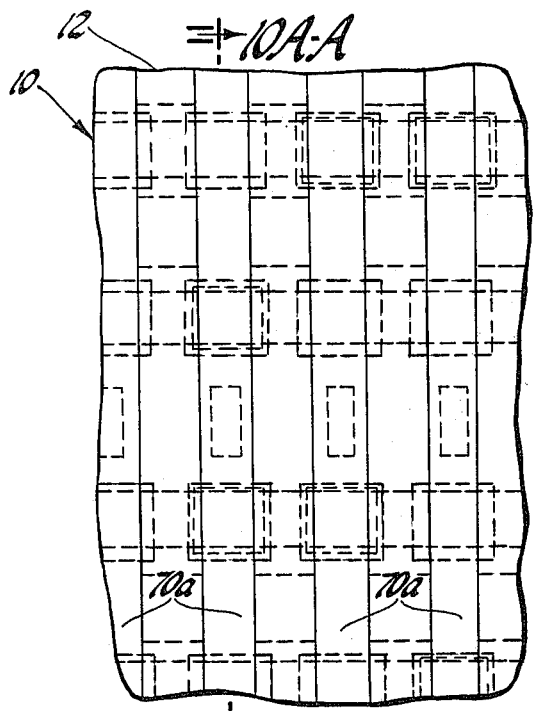
Figure 10A:
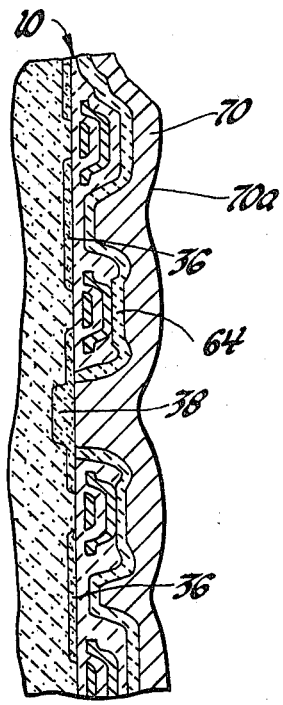
Figure 10B:
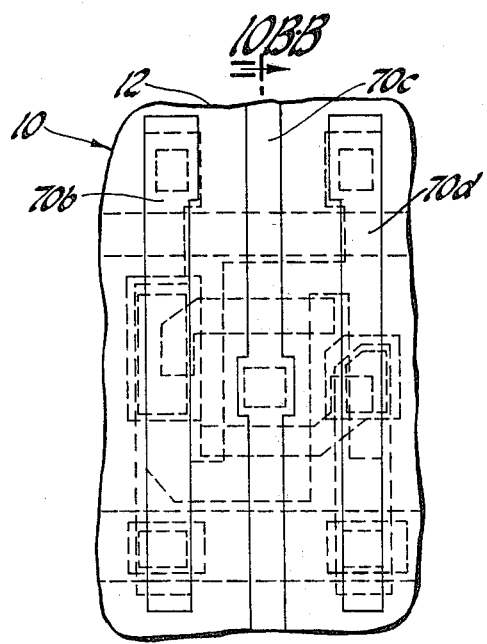
Figure 10B:
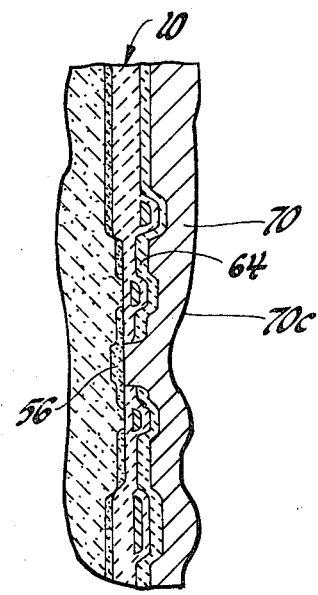

FIGS. 10A and 10B show that the blanket layer of metal 70 is next photolithographically etched, in a normal and accepted manner. The etching delineates a series of parallel metal strips 70a in the ROM area as shown in FIG. 10A. Concurrently, metal 70 is etched over the RAM area, to define a plurality of metal strips 70b, 70c and 70d, as shown in FIG. 10B. Contact to the ROM source region strips 36 is made outside the field of view of FIGS. 10A and 10B. Other metals that might be used for metal 70 include gold and silver. In addition, one might choose to substitute highly doped polycrystalline silicon for metal 70. In essence, metal 70 can be any suitable electrical conductor.

We prefer to illustrate the invention with a shared drain contact because it is the mode in which the invention is most effective. However, it should be recognized that this invention can just as easily be used in a ROM that is expanded in size, and has a discrete drain contact for each IGFET in the array.

While not shown, one would ordinarily choose to apply a passivation layer over the entire surface of the metallized wafer containing chip 10 and then etch windows in it where contacts are to be made to the pattern of metal 70 from external circuitry. We have elected not to show it as a final figure in the drawing, to avoid focusing on something not a part of this invention. Nevertheless, any of the usual final passivation coatings normally used would be useful here. Coatings that can be used include phosphorus doped oxides and silicates. Moreover, it is no more important in this invention than it is in any other ROM. For example, a continuous passivation coating is needed when encapsulating a chip by injection molding. The passivating coating is needed to isolate the chip active areas from adverse interaction with the encapsulating plastic and/or other undesirable contaminants. It is important to use it in our invention too, if the chip is to be packaged by injection molding.

The embodiments of the invention in which an exclusive property or privilege is claimed are defined as follows:

1. A method of making a high density read-only memory and encoding it in later steps of the method comprising:
   forming on a silicon surface, an array of operative IGFETs having shallow source and drain regions and a plurality of generally parallel polycrystalline silicon gate lines and a thermally grown silicon oxide coating on the array;
   opening array enhancement contact windows in said oxide using a mask that also opens ion implantation openings over selected IGFET channels without also exposing gate line edges over said channels;
   significantly altering threshold voltage of said selected IGFET channels by ion implantation;
   diffusing a dopant into silicon exposed by said oxide etching, to enhance IGFET contact formation;
   covering said exposed silicon with an insulating coating;
   etching array contact windows in said insulating coating without also exposing gate line surfaces; and
   forming a conductor pattern for drains in said array, which pattern crosses said gate lines over said channels without incurring significant parasitic interaction therewith.

2. A method of making a high density read-only memory and encoding it in later steps of the method comprising:
   forming an arsenic diffused array of operative IGFETs that includes a plurality of generally parallel self-aligned polycrystalline silicon gate lines and a thermally grown silicon oxide covering thereon;
   coating each gate line over each IGFET channel in said array with a second layer of polysilicon that overlaps edges of said gate lines;
   opening array contact enhancement contact windows using a mask that is also used to open implantation openings in said oxide over selected IGFET channels, said openings traversing said channels but not exposing gate line edges at ends of said channels;
   significantly selectively altering threshold voltage of said selected IGFET channels by ion implantation of said array;
   diffusing phosphorus into silicon exposed in said windows, to enhance IGFET contact formation;
   covering said exposed silicon with a blanket insulating coating that allows only minimal capacitance effects when disposed between an array gate line and drain line;
   etching array contact windows in said insulating coating corresponding to said enhancement windows;
   forming a pattern of drain lines on said coating that cross said gate lines over said selected channels with only minimal capacitance effects to slow array operating speed.

3. A method of making a high density read-only memory and encoding it in later steps of the method comprising:
   forming an arsenic diffused IGFET array having a plurality of generally parallel polycrystalline silicon gate lines covering operative IGFET channels of predetermined threshold voltage and a thermally grown silicon oxide coating on said IGFETs and gate lines;
   at least partially covering gate lines over IGFET channels with islands of a second layer of polycrystalline silicon having a higher electrical resistivity than said gate lines;
   thermally growing silicon oxide on said second polycrystalline silicon layer;
   etching windows in said first and second mentioned silicon oxide, respectively, over IGFET contact areas and over selected IGFET channels intended to be inoperative in said memory, without also exposing gate line edges at ends of said channels;
   significantly selectively raising threshold voltage of said selected IGFET channels above said predetermined threshold voltage by blanket ion implantation of said array before removing an adherent mask thereon used for said etching;
   diffusing phosphorus through said windows, whereby contact formation is enhanced but channel threshold voltage is not significantly affected;
   forming a blanket insulating and surface smoothing layer on said array of a thickness at least that of said second polycrystalline silicon layer;
   etching array contact windows in said insulating layer corresponding to the previously mentioned windows over IGFET contact areas; and
   forming a plurality of generally parallel drain lines on said array that cross said gate lines over said channels but are spaced therefrom by said insulating coating.

4. A method of making a high density read-only memory (ROM) and a random-access memory (RAM) on the same silicon surface and encoding the read-only memory in later steps of the method without adding a mask to the method, said method comprising:
   forming an arsenic diffused ROM and RAM IGFET array on a silicon surface, with the ROM array having a plurality of generally parallel polycrystalline silicon gate lines covering operative IGFET channels, the RAM array including a second level of polycrystalline silicon, and a thermally grown silicon oxide coating covering said arrays;
   covering gate lines over substantially all of said ROM IGFET channels with islands of said second layer of polycrystalline silicon;
   forming a photoresist mask on said arrays that not only has openings for contact enhancement windows but also has ion implant openings therein above selected IGFET channels in said ROM;
   etching windows in said silicon oxide over ROM and RAM contact areas, and incidentally also over said selected IGFET channels without also exposing gate line edges of said channels;
   significantly altering threshold voltage of said selected IGFET channels to make them unresponsive to a predetermined gate line voltage;
   diffusing phosphorus through said windows;
   forming a blanket insulating layer on said array of a thickness at least that of said second polycrystalline silicon layer;
   etching array contact windows in said insulating layer corresponding to said ROM and RAM contact areas; and
   forming a plurality of generally parallel drain lines on said layer over said array that crosses said gate lines over said channels with said insulating layer therebetween.

* * * * *